(12) United States Patent
Paldus et al.

(10) Patent No.: US 6,959,024 B2
(45) Date of Patent: Oct. 25, 2005

(54) LASER TUNING BY SPECTRALLY DEPENDENT SPATIAL FILTERING

(75) Inventors: Barbara Paldus, Sunnyvale, CA (US); Jinchun Xie, Cupertino, CA (US); Robert Lodenkamper, Sunnyvale, CA (US); David M. Adams, Ottawa (CA); Eric Crosson, San Jose, CA (US); Alexander Katchanov, Sunnyvale, CA (US); Grzegorz Pakulski, Woodlawn (CA); Chris W. Rella, Sunnyvale, CA (US); Bruce A. Richman, Sunnyvale, CA (US); Serguei Koulikov, Sunnyvale, CA (US)

(73) Assignee: Picarro, Inc., Sunnyvale, CA (US)

( * ) Notice: Subject to any disclaimer, the term of this patent is extended or adjusted under 35 U.S.C. 154(b) by 120 days.

(21) Appl. No.: 10/308,541

(22) Filed: Dec. 2, 2002

(65) Prior Publication Data

US 2003/0161361 A1 Aug. 28, 2003

Related U.S. Application Data

(63) Continuation-in-part of application No. 10/086,283, filed on Feb. 28, 2002, now abandoned.

(51) Int. Cl.[7] .............................................. H01S 3/10
(52) U.S. Cl. ......................................... 372/20; 372/28
(58) Field of Search .............................. 372/20, 19, 97, 372/108, 9, 12, 13, 22, 26, 18, 70, 23, 24, 372/28, 29.01–33, 6; 356/328, 326

(56) References Cited

U.S. PATENT DOCUMENTS

| | | | | |
|---|---|---|---|---|
| 3,774,121 A | * | 11/1973 | Ashkin et al. ................ 372/53 |
| 4,118,675 A | | 10/1978 | Rahn et al. | |
| 5,189,676 A | * | 2/1993 | Wysocki et al. ............... 372/6 |
| 5,255,274 A | * | 10/1993 | Wysocki et al. .............. 372/26 |
| 5,329,397 A | | 7/1994 | Chang | |
| 5,384,799 A | | 1/1995 | Osterwalder | |
| 5,452,314 A | * | 9/1995 | Aronson ...................... 372/20 |
| 5,724,373 A | | 3/1998 | Chang | |

(Continued)

FOREIGN PATENT DOCUMENTS

GB 2153137 8/1985

(Continued)

OTHER PUBLICATIONS

Coquin et al., "Electronically Tunable External-cavity Semi-conductor Laser," Electronics Letters, vol. 24 (10). May 1988. pp. 599-600.*

(Continued)

*Primary Examiner*—Minsun Oh Harvey
*Assistant Examiner*—Tuan N Nguyen
(74) *Attorney, Agent, or Firm*—Lumen Intellectual Property Services, Inc.

(57) ABSTRACT

A laser tuning mechanism which embodies "spectrally dependent spatial filtering" (SDSF) and contemplates two key elements of the tuning mechanism. The first element of the SDSF tuning mechanism is a spectrally dependent beam distortion (i.e. alteration of the amplitude and/or phase profile of the beam) provided by an SDSF tuning element in a laser cavity. The second element of the SDSF tuning mechanism is an intracavity spatial filter which makes the round trip cavity loss a sensitive function of both beam distortion and cavity alignment. Such a laser can be aligned so that a specific beam distortion, which is provided by the SDSF tuning element at a tunable wavelength, is required to obtain minimum round trip cavity loss, thereby providing tunable laser emission. A preferred embodiment of the SDSF tuning mechanism is an external cavity semiconductor laser having a zeroth order acousto-optic tuning element.

16 Claims, 13 Drawing Sheets

U.S. PATENT DOCUMENTS

| | | | |
|---|---|---|---|
| 5,801,389 A * | 9/1998 | Mizutani et al. ............ | 250/548 |
| 5,812,567 A | 9/1998 | Jeon et al. | |
| 5,835,512 A | 11/1998 | Wada et al. | |
| 5,946,092 A * | 8/1999 | DeFreez et al. ............ | 356/336 |
| 6,473,234 B2 * | 10/2002 | Kuznetsov .................. | 359/578 |
| 6,809,865 B2 * | 10/2004 | Chen .......................... | 359/578 |
| 2002/0041611 A1 | 4/2002 | May ........................ | 372/29.02 |
| 2002/0172239 A1 | 11/2002 | McDonald et al. ........... | 372/20 |

FOREIGN PATENT DOCUMENTS

| | | |
|---|---|---|
| GB | 2207799 | 2/1989 |

OTHER PUBLICATIONS

Zorabedian, "Tuning Fidelity of Acoustooptically controlled External Cavity Senziconductor Lasers," IEEE J. Lightwave Technology, vol. 13(1), Jan. 1995, pp. 62-66.*

Koh et al., "Widely-Tunable Hybrid Semiconductor Lasers," Proc. SPIE, vol. 3631, Jan. 1999, pp. 98-107.*

R. Muller et al., "A narrow-band interference filter with photorefractive LiNbO3" Journal of Pysics D: Applied Physics 27 Feb. 14, 1994, No. 2, Bristol, GB, pp 241-246.

Coquin et al., "Electronically Tunable External-Cavity Semiconductor Laser," Electronics Letters, vol. 24 (10), May 1988, pp. 599-600.

Zorabedian, "Tuning Fidelity of Acoustooptically Controlled External Cavity Semiconductor Lasers," IEEE J. Lightwave Technology, vol. 13 (1), Jan. 1995, pp. 62-66.

Koh et al., "Widely Tunable Hybrid Semiconductor Lasers," Proc. SPIE, vol. 3631, Jan. 1999, pp. 98-107.

Taylor et al., "Electronically Tuning of a Dye Laser Using the Acousto-Optic Filter," Applied Physics Letters, vol. 19 (8), Oct. 1971, pp. 269-271.

Streifer et al., "Analysis of a Dye Laser Tuned by Acousto-Optic Filter," Applied Physics Letters, vol. 17 (8), Oct. 1970, pp. 335-337.

Hutcheson et al., "Electronic Tuning of a Dye Laser with Simultaneous Multiple-Wavelength Output," IEEE J. of Quantum Electronics, Apr. 1974, pp. 462-463.

* cited by examiner

LASER TUNING BY SPECTRALLY DEPENDENT SPATIAL FILTERING

RELATED APPLICATIONS

This application is a continuation-in-part of application Ser. No. 10/086,283, filed Feb. 28, 2002 entitled "Laser Tuning by Spectrally Dependent Spatial Filtering" now abandoned. This application is related to copending, commonly assigned application (reference number PCR-101) entitled "Apparatus and Method for Determining Wavelength from Coarse and Fine Measurements" filed on even date herewith.

FIELD OF THE INVENTION

This invention relates to tunable lasers.

BACKGROUND

A laser consists of a pumped gain medium situated within an optical resonator. The pumped gain medium provides light amplification, and the optical resonator provides optical feedback, such that light circulates within the optical resonator along a beam path and is repeatedly amplified by the gain medium. The optical resonator (or laser cavity) may be either a ring cavity or a standing-wave cavity. Optical pumping and electrical pumping by current injection into the gain medium are two known pumping methods. The emitted light wavelength need not be in the visible part of the electromagnetic spectrum. One of the elements within the optical resonator acts as the output coupler, whereby a certain fraction of the circulating power is emitted from the optical resonator to provide the useful laser output. A partially transmitting mirror is a typical output coupler. For semiconductor lasers, the output coupler is typically an end face of a semiconductor gain chip, which may be coated to provide a reflectivity which optimizes performance. It is frequently useful for laser control to position one or more secondary output couplers in the optical resonator, so that a small fraction of the circulating optical power is emitted from the secondary output coupler(s) in such a way as to be easily separated from the main laser output beam emitted from the output coupler.

A tunable laser is obtained when one or more suitable tuning elements are combined with a gain medium that provides gain in a wavelength band of interest. The most common type of laser tuning element is a tunable optical bandpass filter inserted into the laser cavity. A bandpass filter has relatively low loss in a narrow wavelength band (centered at a center wavelength $\lambda_c$), and relatively high loss for all other wavelengths with significant gain. Since the laser emission wavelength is at or near the wavelength at which the net gain (i.e. gain—loss) is maximal, a tunable bandpass filter is a suitable laser tuning element, provided the variation of filter loss with wavelength is greater than the variation of gain with wavelength.

In order to make a semiconductor laser tunable, it is sometimes desirable to employ an external cavity geometry, to permit the use of tuning elements that cannot be present in a monolithic semiconductor laser cavity. As light makes a round trip within an external cavity semiconductor laser, light is emitted from a pumped semiconductor gain medium, passes through various optical elements, and impinges on the gain medium as a return beam. Semiconductor gain media typically include an epitaxially grown multilayer structure, and are classified according to the propagation direction of the emitted light. A gain medium is a surface emitter if the propagation direction is perpendicular to the plane of the layers. A gain medium is an edge emitter if the propagation direction is in the plane of the layers. Edge emitting semiconductor gain media typically include a single mode optical waveguide. An optical beam emitted from a single-mode optical waveguide has an amplitude and phase profile, referred to as the mode profile, which is determined by the waveguide. The amplitude and phase profile of the return beam is generally not exactly the same as the mode profile, and in such cases, not all of the return beam power is launched (i.e. coupled) into the gain medium waveguide. For example, if a certain power $P_b$ impinges on the waveguide endface, only some lesser amount of power $P_0$ is actually launched into the waveguide. The coupling efficiency $\eta = P_0/P_b$ depends on how close the return beam amplitude and phase profile is to the mode profile.

One kind of laser tuning element is an acousto-optic (AO) device. AO devices are described in textbooks such as J. Xu and R. Stroud, *Acousto-Optic Devices: Principles, Design and Applications*, Wiley, N.Y., 1992. An AO device is a device where an AO interaction is manifested. The AO interaction is a parametric three wave mixing process within a medium where an incident optical beam and an acoustic beam interact to generate one or more diffracted optical beams. Commonly employed AO media include quartz, $TeO_2$, and $Hg_2Cl_2$. However, the AO interaction can occur to some extent in any material medium (i.e. anything except a vacuum). Suitable AO laser tuning elements are typically designed to ensure that the diffracted radiation consists essentially of a single beam, referred to as the diffracted beam or the first order beam. That portion of the incident optical beam which is not converted to the diffracted optical beam is the undiffracted beam, also referred to as the zeroth order beam. Typically, both zeroth order and first order beams are emitted from the medium. The incident beam and the zeroth order beam have the same optical frequency, which differs from the frequency of the first order beam by plus or minus the acoustic frequency. The zeroth and first order beams may also differ in other ways, such as propagating in different directions, and/or having different states of polarization. The acoustic beam in an AO device is typically generated by a transducer affixed to a surface of the medium, where applied electrical power at a suitable radio frequency (RF) acts to launch an acoustic beam having the same frequency into the AO medium.

Since the AO interaction is a parametric three wave mixing process, the incident optical beam is efficiently converted to the diffracted beam only for a narrow range of incident optical beam wavelengths, centered about some center wavelength $\lambda_c$ at which the phase matching condition is met. The center wavelength $\lambda_c$ of the AO interaction can be changed by changing the RF frequency applied to the AO device. Therefore, if we regard an AO device as an optical three port device, with one input and two outputs (zeroth order and first order), then transmission from input to first order output (first order transmission) gives a tunable bandpass filter, and transmission from input to zeroth order output (zeroth order transmission) gives the corresponding tunable notch filter (i.e. relatively high loss for a narrow range of optical wavelengths centered about some center wavelength $\lambda_c$, and relatively low loss for wavelengths outside this range). Although many different AO devices are known, such as AO tunable filters, AO deflectors and AO modulators, this general description (i.e. bandpass filter in first order transmission and notch filter in zeroth order transmission) is generally applicable to AO devices.

Acousto-optic devices were first used to tune dye lasers [e.g. as described in Streifer et al., Applied Physics Letters 17(8) p335 1970; Taylor et al., Applied Physics Letters 19(8) p269 1971; Hutcheson et al., IEEE Journal of Quantum Electronics, p 462 April 1974]. Subsequently, AO devices were used to tune other lasers where the gain medium has a broad bandwidth, such as fiber lasers [U.S. Pat. No. 5,189,676 Wysocki et al; U.S. Pat. No. 5,255,274 Wysocki et al; U.S. Pat. No. 5,812,567 Jeon et al], semiconductor lasers [Coquin et al., Electronics Letters 24(10) p599 1988; Koh et al., Proc. SPIE v3631 p98 1999; Zorabedian, IEEE Journal of Lightwave Technology 13(1) p62 1995], and titanium-doped sapphire lasers [U.S. Pat. No. 5,835,512 Wada et al 1998]. In addition, there are several reports in the patent literature where methods of tuning a laser with an AO device are disclosed, such as [U.S. Pat. No. 4,118,675 Rahn et al 1978] where the AO device simultaneously acts as both a beam deflector and dispersive element to force oscillation at a desired wavelength. GB 2,153,137 Hall et al. 1985, discloses the use of an AO beam deflector and separate dispersive element to tune a laser. U.S. Pat. No. 5,724,373 Chang 1998, discloses a method for AO laser tuning where the AO interaction provides a waveguide mode conversion device, and narrowband filtering is obtained by use of this AO device in combination with appropriate polarization optics within the laser cavity.

In all the above cited references the diffracted (i.e. first order, deflected or mode converted) beam is of primary importance for the tuning mechanism, and the undiffracted (i.e. zeroth order, undeflected or non-mode converted) beam is not utilized by the tuning mechanism. All of these references teach the use of an AO device in first order transmission to tune a laser. Since first order transmission through an AO device entails a frequency shift, much of the prior art cited above is concerned with the effect of the uncompensated frequency shift on laser operation, and/or on various methods of compensating for the frequency shift so as to eliminate its effect on laser operation.

One reference teaches the use of other than the first order beam (although not the zeroth order beam) in an AO interaction to tune a laser. U.S. Pat. No. 5,384,799 Osterwalder 1995, discloses the formation of a periodic refractive index perturbation within an AO device due to a standing acoustic wave. Osterwalder further discloses a tunable narrowband feedback mechanism into the laser cavity, based on the narrowband reflection created by the disclosed periodic refractive index perturbation.

SUMMARY

The present invention comprises a laser tuning mechanism which embodies "spectrally dependent spatial filtering" (SDSF) and contemplates two key elements of the tuning mechanism. The first element of the SDSF tuning mechanism is a spectrally dependent beam distortion (i.e. alteration of the amplitude and/or phase profile of the beam) provided by an SDSF tuning element in a laser cavity. The second element of the SDSF tuning mechanism is an intra-cavity spatial filter which makes the round trip cavity loss a sensitive function of both beam distortion and also cavity alignment. Such a laser can be aligned so that a specific beam distortion, which is provided by the SDSF tuning element at a tunable wavelength, is required to obtain minimum round trip cavity loss, thereby providing tunable laser emission. A preferred embodiment of the SDSF tuning mechanism comprises an external cavity semiconductor laser having a zeroth order acousto-optic tuning element.

Known tunable laser approaches have difficulty providing low tuning time (i.e. <1 ms), high output power (i.e. >40 mW), broad tuning range (i.e. >70 nm), and single mode operation (i.e. SMSR >50 dB) simultaneously. The present invention solves this problem by providing apparatus and method to obtain the indicated level of performance for all of the parameters identified above simultaneously.

DETAILED DESCRIPTION OF THE DRAWINGS

Figure 1:
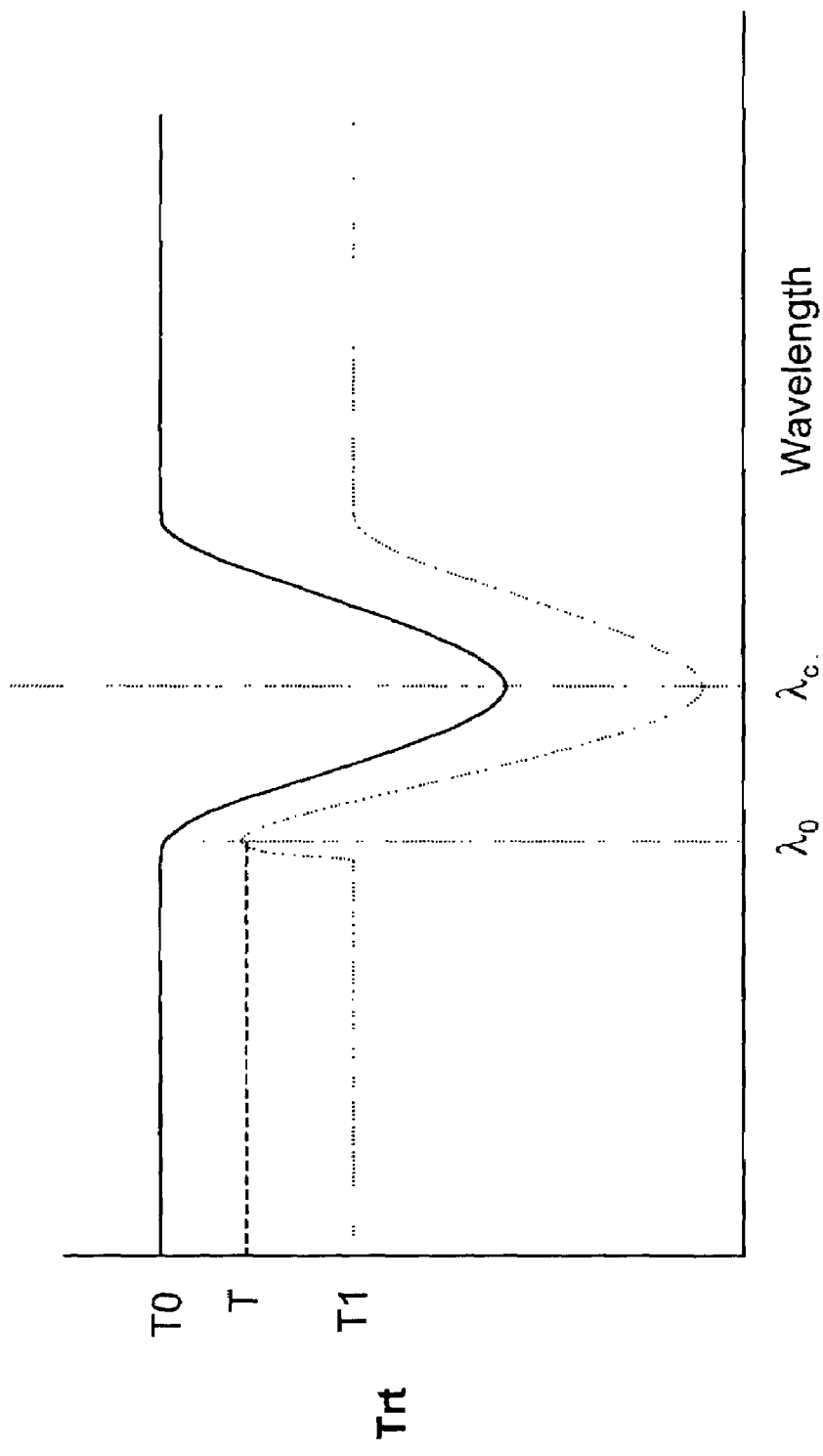
FIG. 1 schematically shows the round trip transmissivity vs. wavelength for two different laser alignments.

The basis of the SDSF tuning mechanism can be understood by reference to FIG. 1. Consider a laser with an SDSF tuning element, such as an AO device operating in zeroth order transmission. Next assume the laser cavity is aligned for maximum output power (i.e. minimum round trip loss) when the beam distortion provided by the SDSF tuning element is negligible. As indicated below, an SDSF tuning element only significantly distorts the beam over a limited range of wavelengths centered at some center wavelength $\lambda_c$. Therefore, the wavelength dependence of the round trip transmissivity will be as indicated by the solid curve on FIG. 1. The transmissivity is roughly constant at a background value T0, and is reduced for wavelengths near $\lambda_c$ due to increased loss attributable to the distortion provided by the SDSF tuning element. Since no transmissivity peak is present, laser tuning cannot be obtained with this cavity alignment.

Now consider the same laser, except that the cavity is aligned such that the beam distortion provided by an SDSF tuning element at a particular wavelength $\lambda_0$ is required for minimum round trip loss. In this situation, the wavelength dependence of the round trip transmissivity will be as indicated by the dotted curve on FIG. 1. Due to the changed alignment of the laser, the background transmissivity T1 is necessarily less than the transmissivity T0. The round trip transmissivity T at $\lambda_0$ is greater than T1 due to the compensation of the cavity "misalignment" by beam distortion, and this creates the peak at $\lambda_0$ shown in FIG. 1. This intracavity bandpass filter is tunable by changing the center wavelength $\lambda_c$, since $\lambda_0$ and $\lambda_c$ will tune together. It is therefore not necessary to vary the cavity alignment in order to tune the laser.

The SDSF tuning mechanism becomes more effective as the round trip cavity loss (or transmittance) is made a more sensitive function of cavity alignment and beam distortion. Thus, the presence of a spatial filter within the laser cavity, either as a separate element, or as an inherent part of another element (i.e. a single mode waveguide gain medium) will enhance the SDSF tuning mechanism by enabling tuning over a greater range of wavelengths. However, there may be cases where spatial filtering is not necessary to practice the invention.

Figure 2:
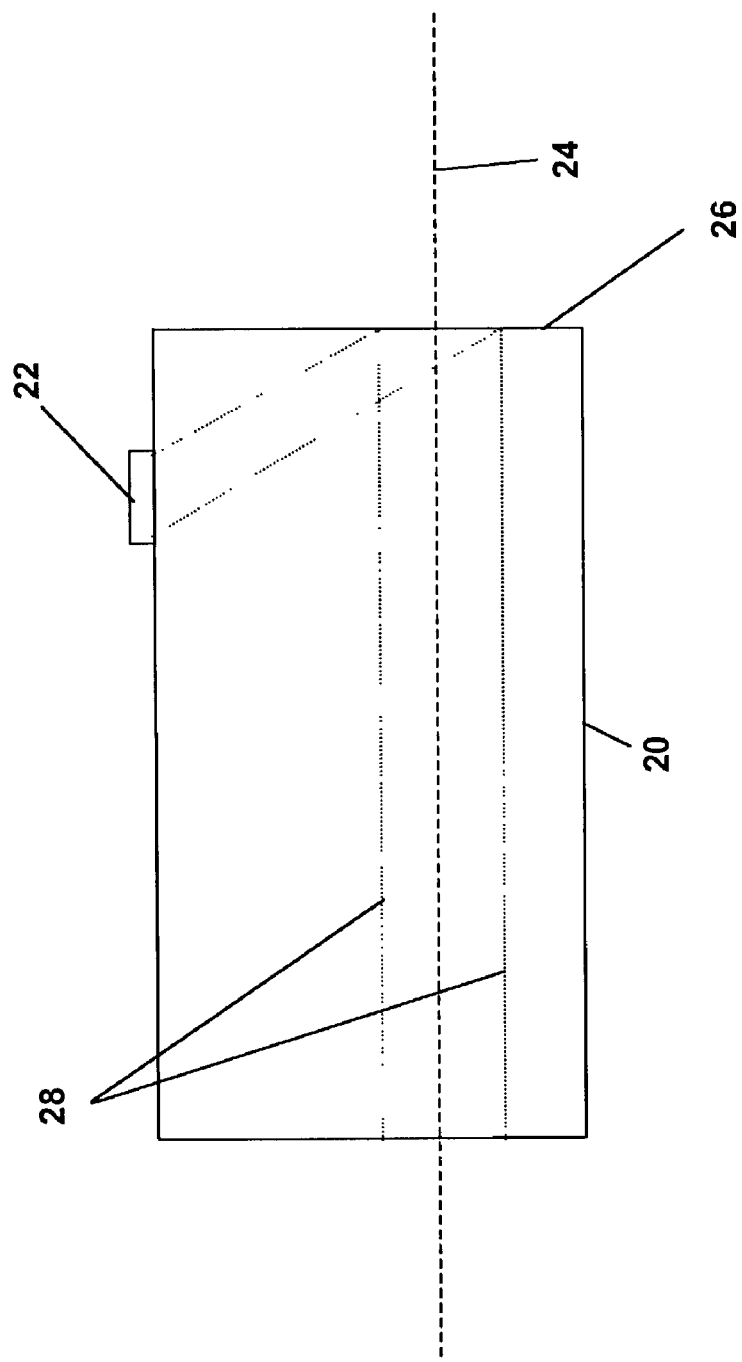
FIG. 2 schematically shows a preferred configuration for the AO tuning element.

A preferred AO tuning element is schematically shown in FIG. 2. AO medium 20 is formed from a suitable acousto-optic material. Preferred materials include materials such as tellurium dioxide ($TeO_2$) and mercurous chloride ($Hg_2Cl_2$), since these materials provide a very high AO figure of merit. In general, an AO interaction is either collinearly or noncollinearly phasematched. For the preferred materials $TeO_2$ and $Hg_2Cl_2$, collinearly phasematched AO interactions are forbidden by crystal symmetry. Therefore, the phasematching in these materials is noncollinear, which means that the acoustic phase velocity is not in the same direction as the phase velocity of the incident optical beam. However, since beams in anisotropic media, such as $TeO_2$ and $Hg_2Cl_2$, propagate in the direction of the group velocity, and the phase and group velocities are typically in different directions, it is still possible to align the acoustic and optical beams in a noncollinearly phasematched AO device in these preferred materials. Collinear alignment of the beams provides the advantages of reduced filter bandwidth and reduced electrical power consumption. One approach for aligning the beams is the use of an acoustic reflection, as shown on FIG. 2, where transducer 22 emits an acoustic beam which is reflected from surface 26 of the device to generate acoustic beam 28 which has a group velocity which is collinear with optical beam axis 24. Kusters (U.S. Pat. No. 3,687,521) teaches the collinear alignment of the optical and acoustic beams in a noncollinearly phasematched AO device, as well as the use of an acoustic reflection to bring about the desired alignment of the beams. The acoustic anisotropy in materials such as $TeO_2$ and $Hg_2Cl_2$ is so large that the acoustic reflection is as schematically indicated on FIG. 2 (i.e. the angle of reflection is substantially different from the angle of incidence), which is helpful for aligning the beams. In some cases, it is preferable to place transducer 22 on a cut face of medium 20 that does not make a right angle with surface 26 in order to align the optical and acoustic beams.

Although we have demonstrated laser tuning using various AO devices as the laser tuning element, a presently preferred AO tuning element is a $TeO_2$ device with the collinear beam configuration as shown in FIG. 2, where the interaction length is approximately 20 mm. The following results pertain to the preferred AO tuning element described in this paragraph. Since the AO tuning element has no moving parts, rapid laser tuning (i.e. tuning time <1 ms) can be obtained.

Figure 3:
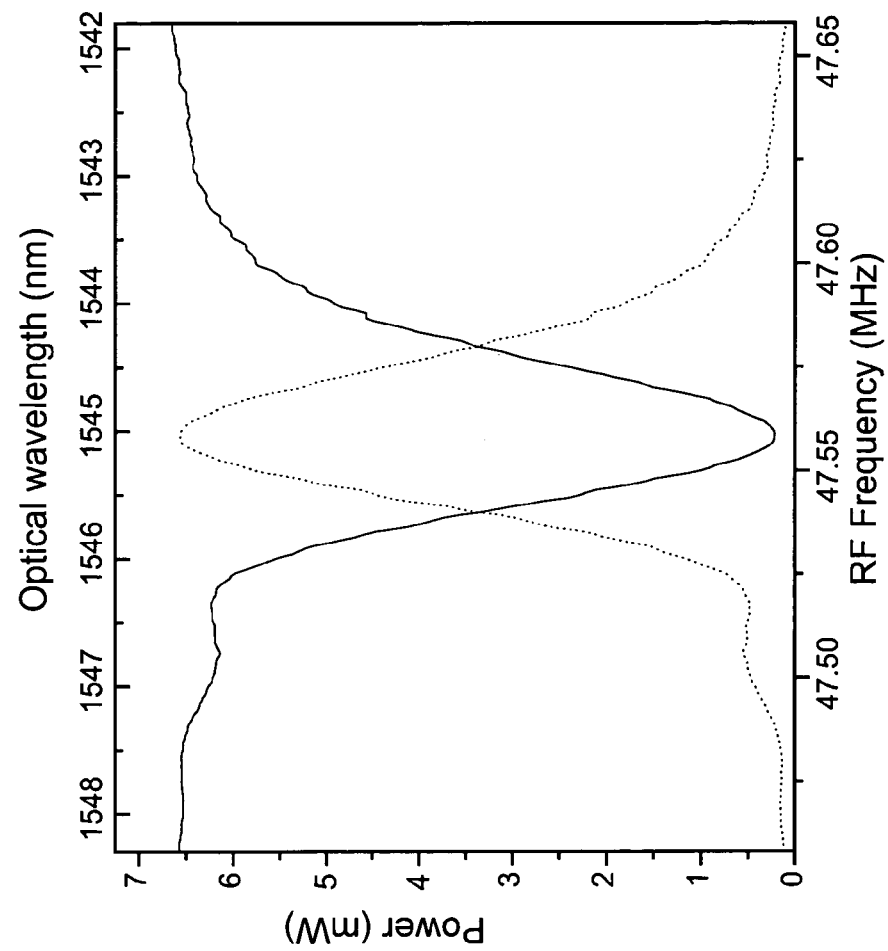
FIG. 3 shows measured power in zeroth and first order beams vs. wavelength for an AO tuning element.

FIG. 3 shows measured spectra for zeroth order (solid line) and first order (dotted line) transmission through a $TeO_2$ AO tuning element having the configuration shown in FIG. 2. For this measurement, approximately 90 mW of RF power is applied to transducer 22, and this value of RF power is chosen to maximize diffraction efficiency into the first order beam. If the RF power is larger than 90 mW, the diffraction efficiency is reduced, since power is transferred from the zeroth order beam to the first order beam and then back into the zeroth order beam as the beams pass through the tuning element. The RF frequency applied to transducer 22 is varied as indicated on the lower horizontal axis of FIG. 3, and the zeroth order output and first order output are measured. The input optical wavelength is held constant as the RF frequency is varied. Since an AO interaction defines a one-to-one relation between RF frequency and optical wavelength, the wavelength spectra are related to the RF spectra as indicated by the upper and lower horizontal axes on FIG. 3. Thus the directly measured RF spectrum at a fixed wavelength of roughly 1545 nm is equivalent to the optical spectrum obtained at a fixed RF frequency of roughly 47.56 MHz. As seen on FIG. 3, the AO tuning element provides a notch filter in zeroth order transmission, i.e. relatively high loss for wavelengths in a narrow wavelength band centered on a center wavelength $\lambda_c$ (roughly=1545 nm) and relatively low loss for all other wavelengths. Such notch filtering is a characteristic property of SDSF tuning elements, as indicated in the discussion of FIG. 1.

Figure 4:
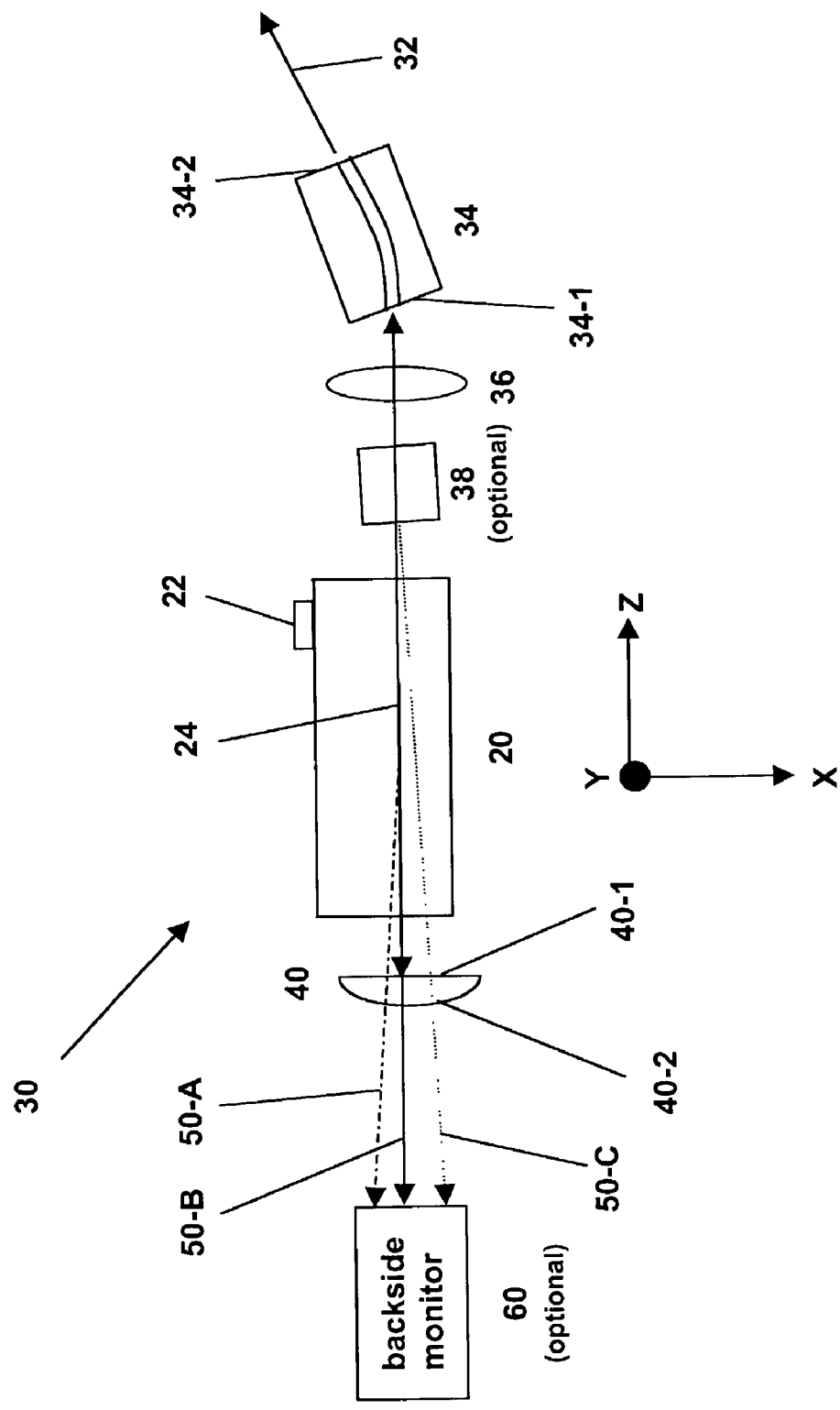
FIG. 4 schematically shows an embodiment of the invention.

FIG. 4 is a schematic diagram of a tunable laser assembly 30 constructed according to an embodiment of the invention. It is convenient to start the discussion at output face 34-2 of semiconductor gain element 34 and follow a round trip within the laser cavity. Output face 34-2 is preferably coated to provide a low level of reflectivity which optimizes laser output power. Typical reflectivities for output face 34-2 are approximately in the range of 1 to 10 percent. Light reflected from output face 34-2 propagates through gain element 34 and is emitted from internal face 34-1 of gain element 34. Gain element 34 is preferably an electrically pumped semiconductor single or multiple quantum well structure which is also a single mode optical waveguide. For emission wavelengths at or near 1.5 microns, it is also preferable to grow the structure so that the quantum wells are under compressive strain, to provide optical gain primarily for TE polarized light. The preferred quantum well strain for other emission wavelengths is not necessarily compressive strain. Tensile strain, or no strain, may be preferred, depending on the particular desired emission wavelength. Internal face 34-1 is preferably anti-reflection coated and designed to intersect the waveguide axis of gain element 34 at an acute angle, as shown in FIG. 4. These measures both tend to reduce deleterious effects of reflections from internal face 34-1 on laser operation.

Optical radiation is emitted from internal face 34-1 of gain element 34 as a beam with approximate horizontal and vertical beam divergences of 40 degrees and 52 degrees respectively (full angle 1/e intensity width). Laser tuning according to the present invention has been observed with a variety of semiconductor gain elements, having various beam divergences, so these parameters are not crucial for practicing the invention. The beam emitted from internal face 34-1 propagates to lens 36, which collimates the beam. A currently preferred lens 36 is Geltech model 350140, which is an aspheric lens with 1.45 mm focal length, but other lenses with various focal lengths can be employed to practice the invention. The collimated beam propagates from lens 36 to grid fixing etalon 38, which is optional. Since grid fixing etalon 38 is optional, discussion of its properties and effect on laser performance will be deferred.

The beam exiting lens 36 (and etalon 38 if it is present), is received by AO medium 20 and propagates along optical axis 24 within AO medium 20. Preferably, AO medium 20 is as described in the prior discussion of FIG. 2. Electrical power at a suitably chosen RF frequency is applied to transducer 22 which is affixed to AO medium 20. Transducer 22 generates an acoustic beam which propagates within AO medium 20. The AO interaction of the optical beam propagating along beam axis 24 and the acoustic beam generated by transducer 22 gives rise to a first order optical beam (dash-dotted line, later labeled 50-A). The undiffracted, or zeroth order, beam is emitted from AO medium 20 and impinges on return mirror 40. Return mirror 40 has an internal surface 40-1 coated to provide high reflectivity. A typical reflectivity for internal surface 40-1 is approximately 99%. Internal surface 40-1 of return mirror 40 and external face 34-2 of gain element 34 are the two surfaces which define the laser cavity for laser assembly 30. Thus, a cavity round trip is completed by reflection of the zeroth order beam from internal surface 40-1, then propagation back through AO medium 20, etalon 38 (if present), lens 36, and gain element 34. Laser output beam 32 is emitted from external face 34-2 of gain element 34.

Additional optical elements may be placed outside the laser cavity in the path of output beam 32 to provide increased functionality. For example, output power monitoring, output power control, high speed modulation with a data signal, improvement of the polarization purity of the beam, and/or coupling to an optical fiber are all functions which can be implemented with suitable elements placed outside the laser cavity. Output power control is particularly significant for applications which require the same output power at all emission wavelengths, or the same output power over a laser lifetime. Typically, a variable optical attenuator is used to provide output power control, although alternatively a gain element can be used to perform this function. Output power control can also be obtained by suitable control of gain element 34, but in many cases it is preferable for output power control to be performed by elements in the output beam path, as indicated above.

Some applications require stable single-mode operation of the laser for extended periods of time. In order to ensure stable, single-mode laser operation, various signals can be obtained from within the cavity of laser assembly 30 to enable control of the laser. FIG. 4 shows three monitor beams 50-A, 50-B and 50-C which are coupled into optional monitor subassembly 60. Preferably, these beams are obtained by transmission through return mirror 40, so internal surface 40-1 of return mirror 40 preferably has an appropriate transmissivity (e.g. approximately 1%), and external surface 40-2 of return mirror is preferably curved to properly focus the three beams into monitor subassembly 60. Beam 50-A, indicated with a dash-dotted line on FIG. 4, is the fraction of the first order beam which is transmitted through return mirror 40. Beam 50-B, indicated with a solid line on FIG. 4, is the fraction of the zeroth order beam which is transmitted through return mirror 40. Beam 50-C, indicated with a dotted line on FIG. 4, is the fraction of the beam generated by reflection from a surface of grid fixing etalon 38 which is transmitted through return mirror 40. Beams 50-A, 50-B and 50-C all propagate in slightly different directions, as shown in FIG. 4. Beams 50-A and 50-B propagate in different directions due to noncollinear phase-matching in AO tuning element 20. Grid fixing etalon 38 must be tilted so that beams reflected from its surfaces leave the laser cavity, and this tilt can be chosen to ensure separation of beam 50-C from beams 50-A and 50-B as shown on FIG. 4. The operation of monitor subassembly 60 will be discussed below.

Monitor subassembly 60 is shown as optional, since the invention may be practiced without control of the laser based on monitor signals. For an embodiment without monitor subassembly 60, there is no need to provide beams 50-A, 50-B and 50-C, and there is no also need to design an appropriate curved external surface 40-2 of return mirror 40.

Figure 5:
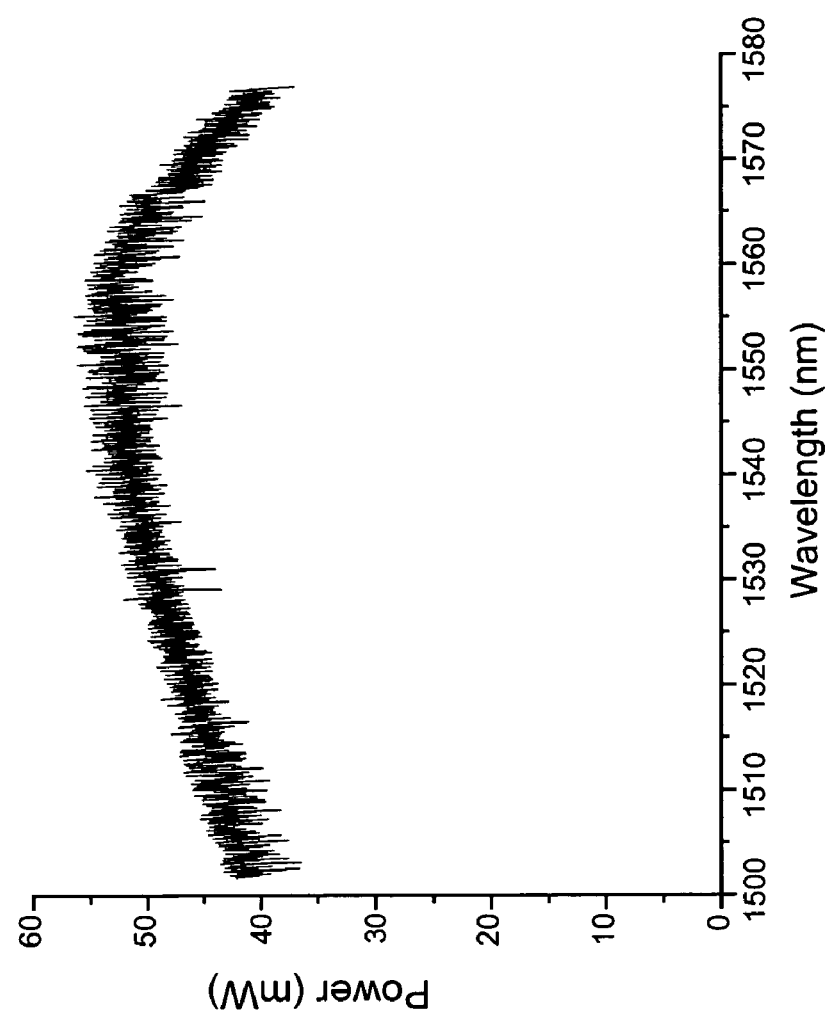
FIG. 5 shows measured output power vs. emission wavelength from an embodiment of the invention.

FIG. 5 shows measured fiber-coupled output power vs. emission wavelength for an embodiment of the invention as shown in FIG. 4. High power (i.e. >40 mW fiber coupled power) over a broad tuning range (>70 nm) is obtained.

Figure 6:
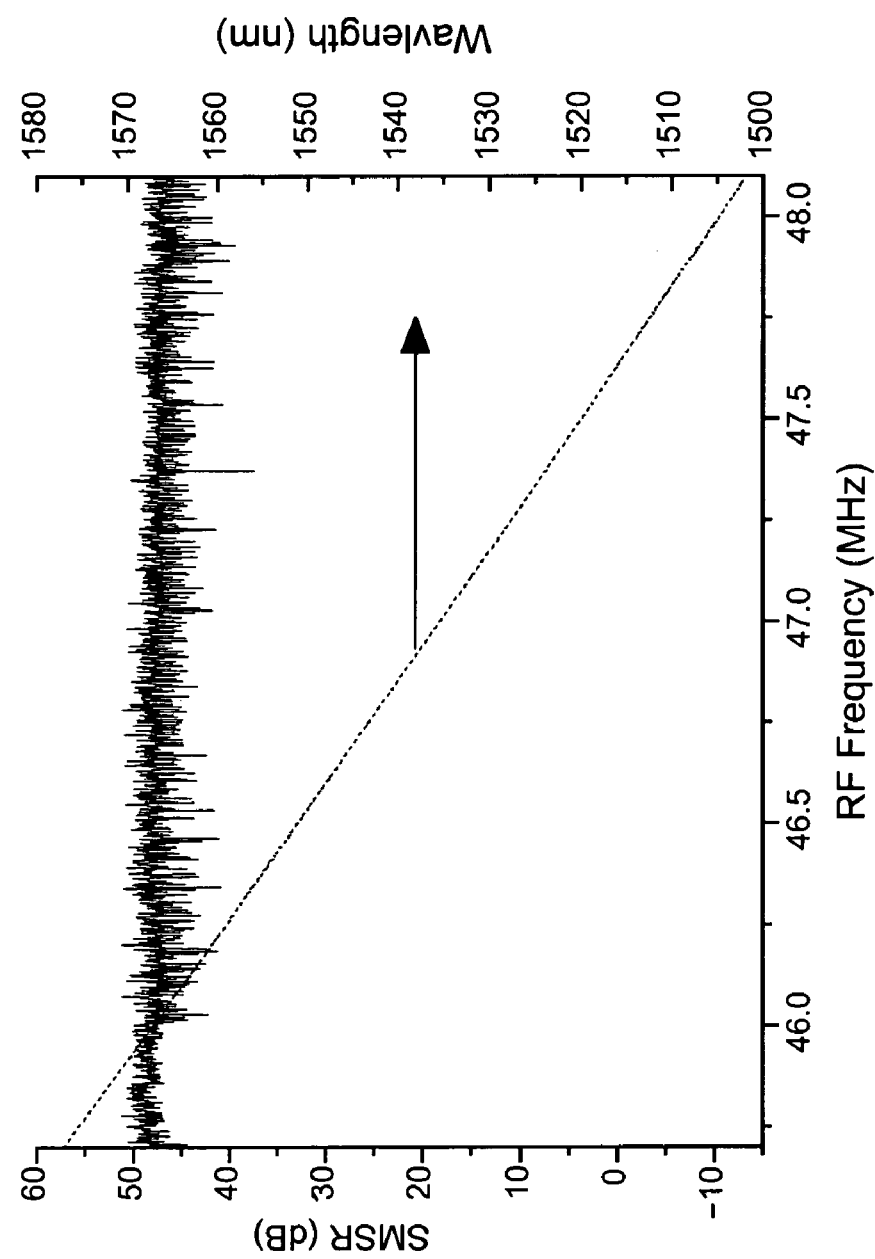
FIG. 6 shows the tuning curve and measured side mode suppression ratio for an embodiment of the invention.

FIG. 6 shows the measured side mode suppression ratio (SMSR) in dB log scale (solid line and left vertical axis) and emission wavelength (dotted line and right vertical axis) as functions of RF frequency applied to the AO medium corresponding to the results shown in FIG. 5. The emission wavelength curve gives the relation between RF frequency applied to transducer 22 of AO tuning element 20 to laser emission wavelength, and the SMSR is the ratio of the power in the desired lasing mode to the power in the most intense "non-lasing" mode. The high SMSR over the entire tuning range as seen in FIG. 6 demonstrates single-mode lasing over the entire tuning range.

Figure 7:
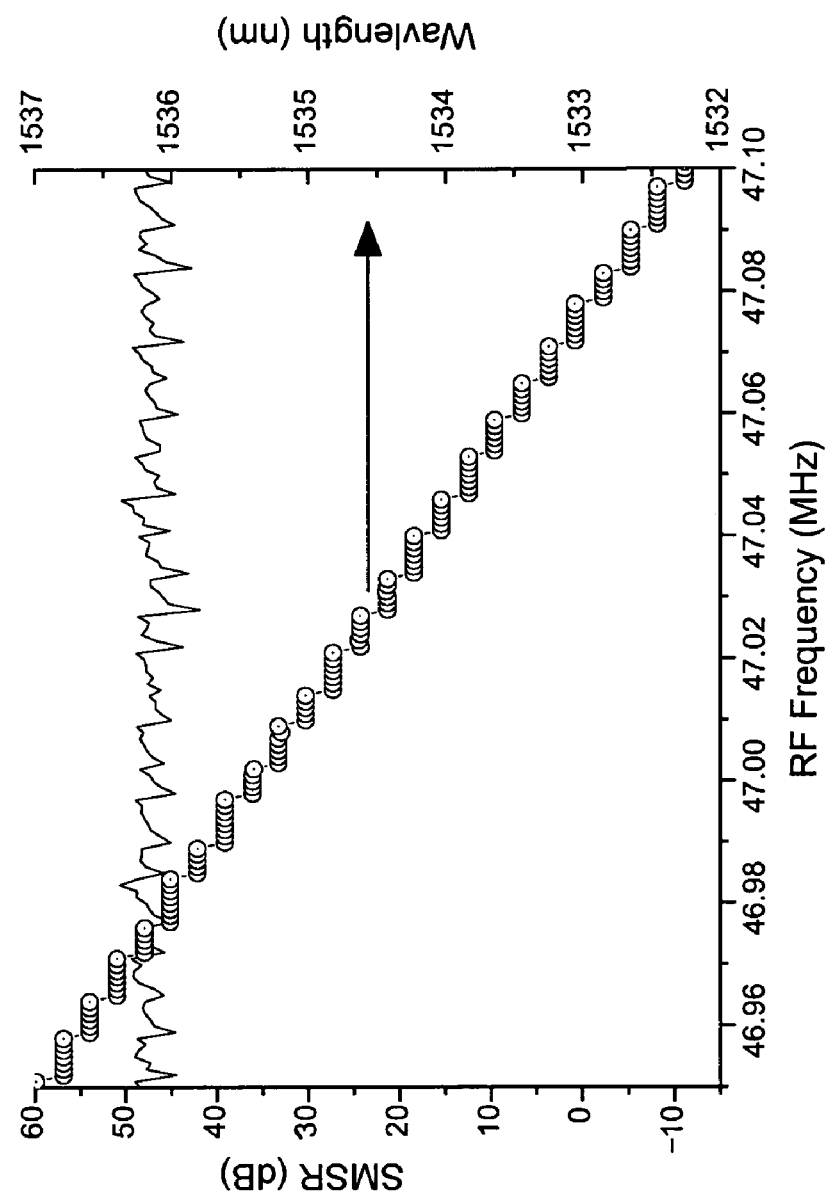
FIG. 7 shows a portion of the tuning curve and measured side mode suppression ratio for an embodiment of the invention.

FIG. 7 shows a small section of the results of FIG. 6 on a magnified scale. Here, the effect of grid fixing etalon 38 is clearly seen, since the laser discretely tunes from roughly one etalon transmission peak to the next, and does not tune to intermediate wavelengths. The reason for this is that grid fixing etalon 38 introduces a high intracavity loss at all wavelengths except at its transmission peaks. Here the spacing of the etalon transmission peaks, which is referred to as the free spectral range (FSR) of the etalon, is 25 GHz, and the laser tunes to channels (i.e. wavelengths) which are 25 GHz apart. Free space wavelength $\lambda$ and frequency f are related by $c=\lambda f$ where c is the free space speed of light, so the "color" of monochromatic light may be specified either by giving its wavelength or its frequency. Discrete tunability is advantageous for applications where the laser is required to tune only to discrete channels equally spaced in frequency, such as in dense wavelength division multiplexing (DWDM) applications. Excellent open loop wavelength accuracy can be obtained by lining up the laser channels as defined by the transmission peaks of the grid fixing etalon with the desired frequency grid during laser assembly, and measured open-loop deviations from the desired grid are typically less than 1 GHz over a tuning range of at least 5 THz.

In some DWDM applications, such as sources for test equipment, the open loop wavelength accuracy provided by discrete tunability is sufficient. In these cases, discrete tunability allows the wavelength control loop that is typically necessary for tunable sources to be eliminated. For other DWDM applications, such as sources for optical communication, discrete tunability may not permit elimination of the wavelength control loop. In such cases, discrete tunability still provides advantages, such as reduced total size and part count (relative to a laser +external locker configuration), and greater flexibility in overall laser control, since wavelength accuracy is ensured with a stable, passive intracavity device.

In order to perform its intended function, grid fixing etalon 38 in FIG. 4 is preferably inserted into the laser cavity such that the etalon surface normals make a small angle (preferably 0.1–2 degrees) with respect to the cavity axis, to thereby ensure that the beams reflected from the etalon surfaces do not efficiently couple into the laser cavity. The etalon finesse is moderate (e.g. 2<finesse<10), and this value of finesse is chosen to provide low loss in transmission through the tilted etalon, and the desired level of spectral selectivity. Since the etalon serves as an absolute wavelength reference for the laser, the etalon is preferably fabricated using materials, such as fused silica, that are mechanically stable and temperature insensitive.

The advantages provided by insertion of a grid fixing etalon within a tunable laser can also be achieved using similar methods, such as by appropriately engineering a parasitic etalon that is already present within the cavity (e.g. an etalon formed by the two faces of a semiconductor gain element) to perform the grid fixing function. It is also possible to use the overall optical path length of the laser cavity to perform the grid fixing function, since the longitudinal mode spacing of a laser is determined by the round trip optical path length. In general, we refer to lasers that either have one or more grid fixing etalons, or that employ equivalent methods, as featuring "discrete tunability".

As indicated above, discrete tunability can be implemented or modified by several distinct physical mechanisms, which are typically simultaneously present to varying degrees in practice. For example, even when the effect of the parasitic etalon formed by the faces of gain element 34 on FIG. 4 is reduced by AR coating and tilting as indicated above, this parasitic etalon can still affect laser performance. In the presence of multiple mechanisms which tend to implement and/or affect discrete tunability, it is advantageous to ensure the various mechanisms operate consistently with each other to achieve the desired result.

In a laser where discrete tunability is achieved by insertion of a grid fixing etalon, it is desirable to select the gain element (chip) length so that its parasitic etalon has a free spectral range (FSR) that is substantially equal to the grid fixing etalon FSR divided by an integer $\geq 1$. When this is done, the parasitic chip etalon will have the same effect on laser operation at all channels. Thus the tendency of the chip etalon to interfere with tuning by inducing mode hops to channels which have reduced chip etalon induced loss is decreased. It is also desirable to choose the overall laser cavity length to provide a laser cavity longitudinal mode spacing (referred to as the laser cavity FSR) that is substantially equal to the grid fixing etalon FSR divided by an integer $\geq 2$. For example, if the grid fixing etalon has an FSR of 25 GHz, then 12.5 GHz or 8.33 GHz or other integer submultiples of 25 GHz are all preferable values for the FSR of the laser cavity. Since the loss introduced by misalignment of the cavity mode frequency comb relative to the channels defined by the grid fixing etalon is the same for adjacent channels if the cavity FSR is a submultiple of the etalon FSR, the tendency of the laser to mode hop is reduced.

The results shown in FIGS. 5–10 are for a laser configuration with a 25 GHz grid fixing etalon where the cavity FSR is a submultiple of 25 GHz and the chip length is approximately 860 microns. The resulting chip etalon FSR is approximately 50 GHz. Although this laser demonstrates excellent performance as seen in the indicated figures, it is preferred for the chip etalon FSR to match the grid etalon FSR (i.e. 25 GHz for this particular case), for the reasons given above. The preferred chip length for a 25 GHz laser is roughly 1.7 mm, which is rather long for a gain chip. We have found that gain chip nonlinearities can interfere with single mode tuning performance, and that gain chip nonlinearities tend to increase as the chip length increases, if no change is made to the epitaxial design of the gain chip. Thus the design of a preferred gain chip is normally achieved by first setting the chip length to match the desired discrete tunability frequency spacing, then designing the active region (especially the number of quantum wells) to provide good tuning performance and high power at the predetermined length.

Implementation of the present invention does not require discrete tunability, or a grid fixing etalon within the laser cavity. A preferred embodiment of the invention has a grid fixing etalon inserted into the cavity to realize the indicated additional advantages of discrete tunability that are over and above the advantages provided by the SDSF laser tuning mechanism.

Figure 8:
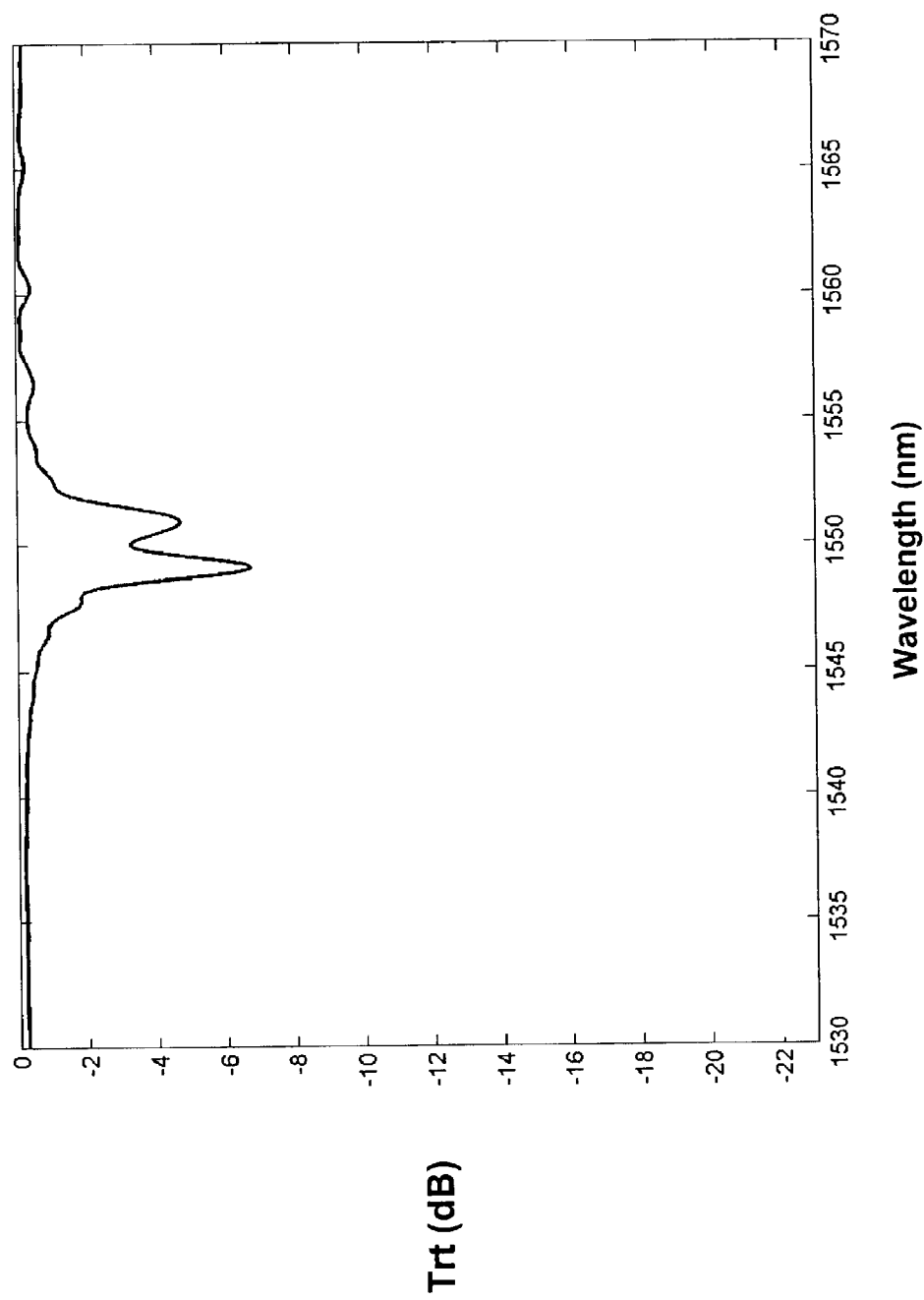
FIG. 8 shows measured round trip transmissivity vs. wavelength for a nominal laser alignment.

FIG. 8 shows measured round trip cavity transmission vs. wavelength for a laser as indicated in FIG. 4 with a nominal cavity alignment. This measurement is performed with gain element 34 operating below threshold, so the effects of spatial filtering at the gain element waveguide end faces is included in the measurement. Nominal alignment means that all passive optical elements are centered on the beam axis, AO medium 20 is aligned so that the zeroth order optical beam and acoustic beam within the medium are coaligned as indicated on FIG. 2, return mirror 40 is aligned for retro reflection of the zeroth order beam, and lens 36 is aligned for minimum round trip loss with no RF supplied to AO tuning element 20. As expected, the round trip loss for the nominal alignment is low for all wavelengths which are far away from the center wavelength of the AO interaction, since this nominal alignment will clearly give minimal round trip loss in the absence of AO-induced beam distortion and attenuation. The RF power applied to transducer 22 is 250 mW for the measurement shown in FIG. 8. Since peak notch depth for AO medium 20 is observed at 90 mW RF power, as indicated in the discussion of FIG. 3, an applied RF power of 250 mW places AO medium 20 into an overdriven state, which accounts for the double valley structure of the notch in FIG. 8.

The curve in FIG. 8 shows no bandpass filtering behavior, and as expected from this result, a laser as indicated in FIG. 4 with nominal alignment does not provide tunability. The discussion of FIG. 1 emphasized the importance of choosing a laser alignment which differs from the nominal alignment in order to enable the SDSF tuning mechanism. Of course, there are many ways for the alignment of a laser to differ from the nominal alignment, including but not limited to: a tilt of return mirror 40 away from the alignment for retro reflection, a translation of lens 36 along the optical axis of the laser cavity, a lateral translation or a tilt of AO medium 20 away from the condition of overlapping optical and acoustic beams, and decentering or tilting other optical elements such as lens 36 or gain element 34.

In principle, any combination of the above alignments may enable the SDSF tuning mechanism. The presently preferred SDSF enabling alignments are tilting of return mirror 40 about the y axis on FIG. 4, and lateral translation of AO medium 20 in the x direction on FIG. 4. Restricting the alignment to a 2-D parameter space enables systematic exploration of the parameter space, and excellent laser performance has been obtained for optimized alignment parameters. Other alignment parameters are preferable in some instances to the mirror tilt and AO tuning element position for enabling the SDSF tuning mechanism.

Figure 9:
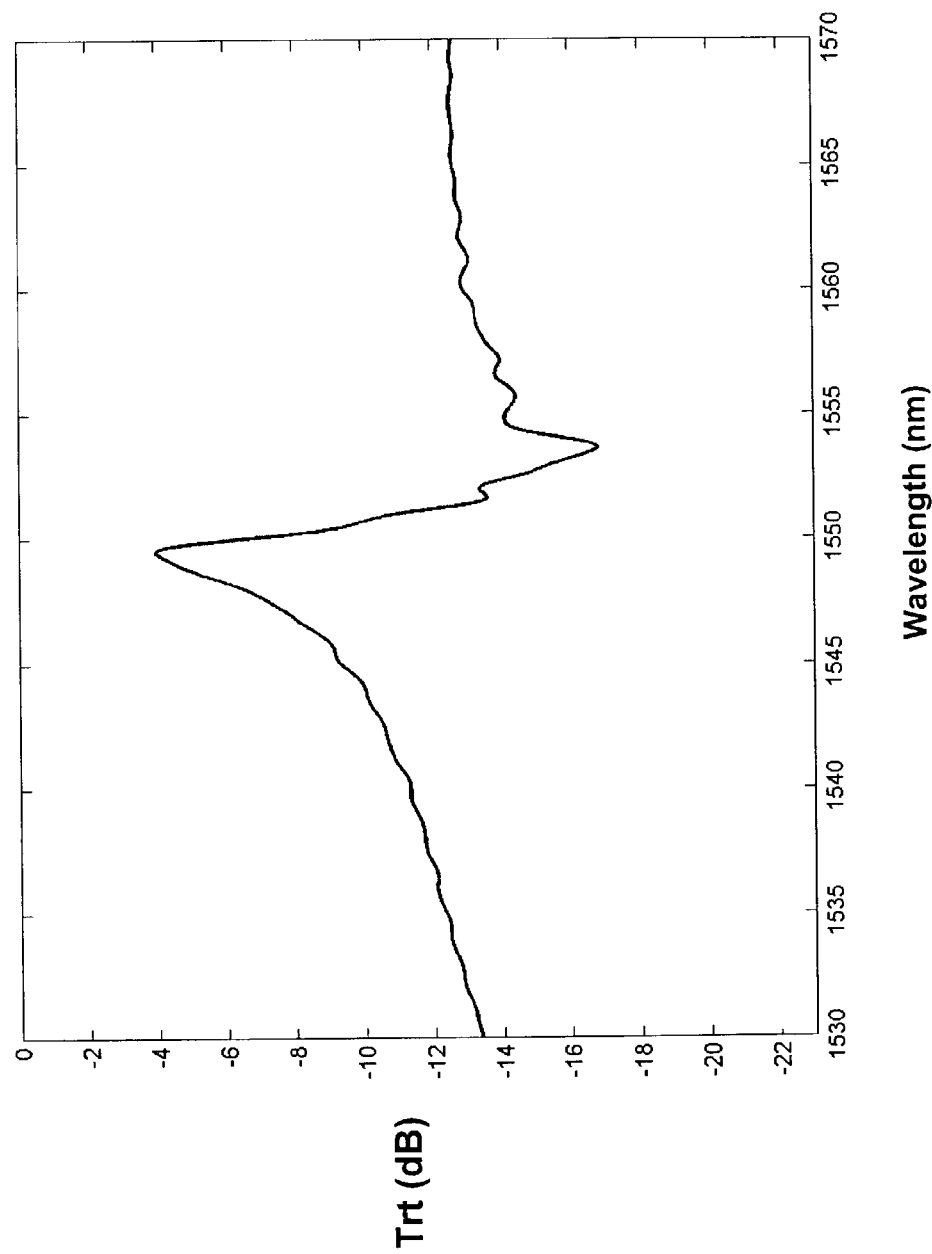
FIG. 9 shows measured round trip transmissivity vs. wavelength for an optimized laser alignment.

FIG. 9 shows round trip cavity transmission vs. wavelength for a laser as indicated in FIG. 4 where return mirror 40 is tilted by 0.84 mrad about the y axis on FIG. 4 away from a retro reflection condition and AO medium 20 is laterally translated by 0.7 mm in the x direction on FIG. 4 away from a condition of overlapping optical and acoustic beams. The results shown in FIGS. 5, 6 and 7 are also obtained with this cavity alignment. As seen on FIG. 9, a pronounced round trip transmission peak is present, which is the bandpass filter responsible for laser tuning via the SDSF tuning mechanism.

Figure 10:
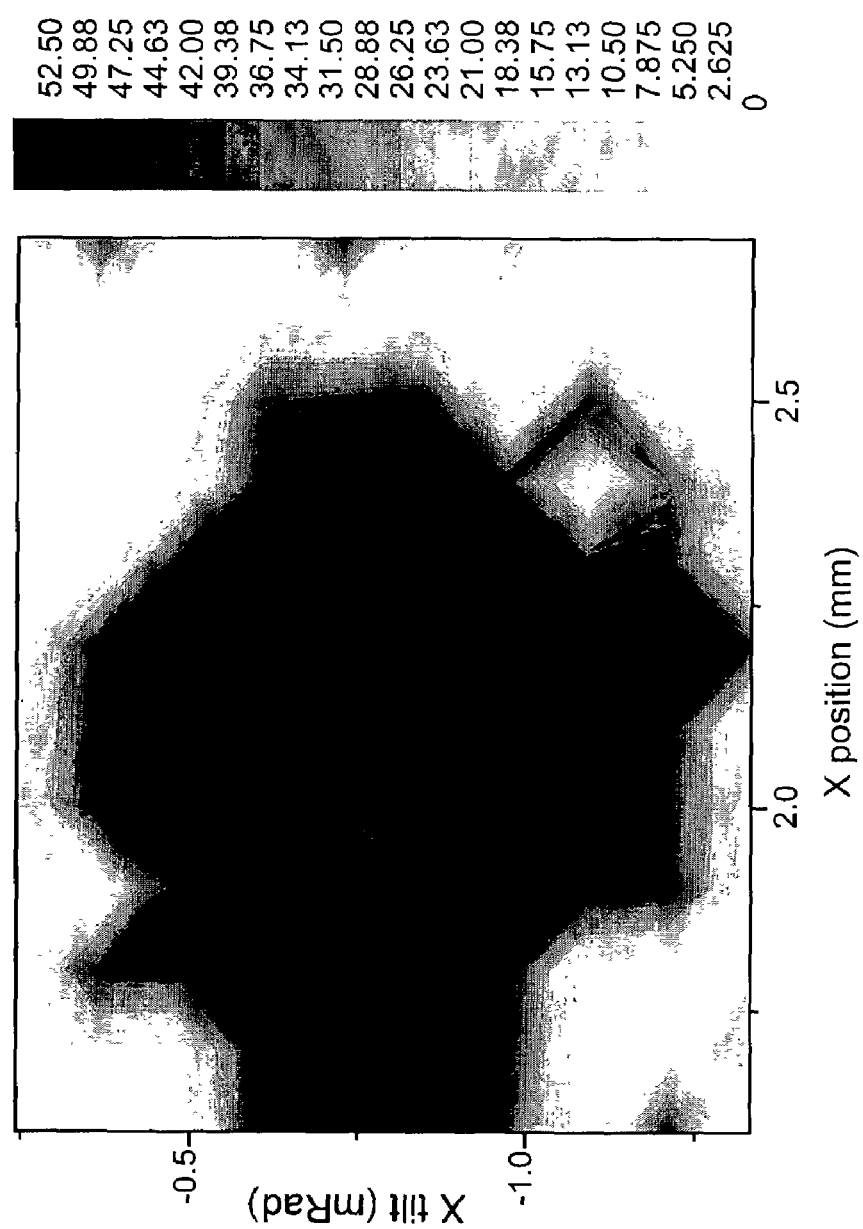
FIG. 10 shows measured side mode suppression ratio vs. two laser alignment parameters: return mirror tilt and AO tuning element position.

FIG. 10 shows a 2-D grayscale plot of the measured laser SMSR vs. the tilt and position alignment parameters. Increased SMSR, indicated by darker shading on FIG. 10, corresponds to improved laser performance. FIG. 10 shows good laser performance over a range of parameter values centered roughly on tilt=−0.8 mrad and position=2.1 mm. Since position=2.8 mm is the position of AO medium 20 at which the optical and acoustic beams overlap precisely, the deviation from "nominal" alignment is 0.7 mm. The operating point chosen in FIGS. 5, 6, 7, and 9 is centered in the region of high SMSR indicated on FIG. 10.

Although the above numerical values might change if the components that comprise the laser system change, appropriately modified values may readily be obtained by procedures similar to those outlined above. It is also possible that changing the components that comprise the laser will require a choice of preferred alignment parameters other than the mirror tilt and AO tuning element translation identified above. Skilled art workers will be able to easily determine which alignment parameters to use to enable the SDSF tuning mechanism for a given set of laser components.

Figure 11:
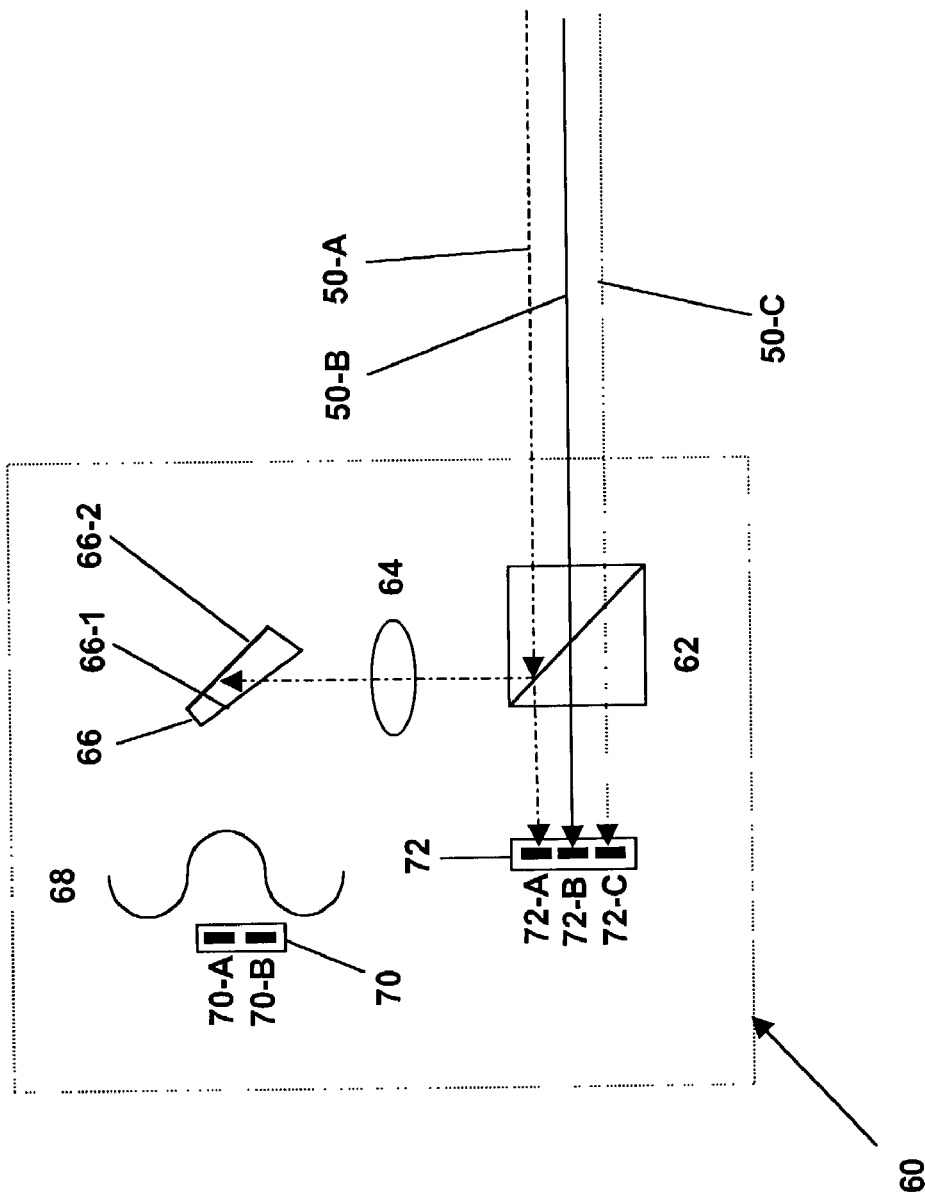
FIG. 11 shows an embodiment of a monitor subassembly.

FIG. 11 shows a schematic diagram of an embodiment of monitor subassembly 60, which provides means for monitoring. On FIG. 11, beams 50-A, 50-B and 50-C enter monitor subassembly 60. As indicated in the discussion of FIG. 4, beam 50-A is the fraction of the first order beam that passes through return mirror 40, beam 50-B is the fraction of the zeroth order beam that passes through return mirror 40, and beam 50-C is the fraction of the beam generated by reflection from a surface of grid fixing etalon 38 which is transmitted through return mirror 40. Beams 50-B and 50-C have the same polarization, which is orthogonal to the polarization of beam 50-A, since beam 50-A is generated from beam 50-B via a birefringent AO interaction in AO medium 20. Beams 50-A, 50-B and 50-C are received by polarizing beam splitter 62, which is designed for minimal reflection and maximal transmission of beams 50-B and 50-C, and partial reflection and transmission of beam 50-A, as indicated on FIG. 11.

The transmitted portion of beam 50-A is received by detector 72-A which is an element of detector array 72. The reflected portion of beam 50-A passes through lens 64 and impinges on wedged interferometer 66. Reflections of beam 50-A are generated from front surface 66-1 of wedged interferometer 66 and back surface 66-2 of wedged interferometer 66 and these two reflected beams interfere to create fringe pattern 68 (schematically indicated with a wavy line on FIG. 11). Detector array 70, having two elements 70-A and 70-B is positioned so that elements 70-A and 70-B sample two points in fringe pattern 68 that are separated by approximately one quarter of the fringe pattern spatial period as measured on the line passing through the centers of both detectors, as indicated on FIG. 11. If a fringe maximum is present on one of the detector elements, then the other detector element will sample a half-maximum point of the fringe pattern. This 90 degree spacing (or any odd integer multiple thereof) between the detectors is referred to as "spatial quadrature". Lens 64 is chosen to ensure proper alignment of fringe pattern 68 with detector array 70. A coating is deposited on back surface 66-2 of wedged interferometer 66 that provides a linear dependence of reflectivity on wavelength.

Elements 72-A, 62, 64, 66, 66-1, 66-2, 70, 70-A and 70-B on FIG. 11 comprise a wavelength monitor, where the signals from detectors 70-A, 70-B and 72-A can be used to determine the emission wavelength of the laser. A detailed description of the operation of these elements as a wavelength monitor is given in copending, commonly assigned application entitled "Apparatus and Method for Determining Wavelength from Coarse and Fine Measurements", the disclosure of which is incorporated by reference herein. Briefly, the signal from detector 72-A is used to normalize the signals from detectors 70-A and 70-B to remove the effect of power variation. Normalized signals from detectors 70-A and 70-B suffice to measure the absolute wavelength sufficiently accurately to determine the channel of laser operation.

Beams 50-B and 50-C are received by elements 72-B and 72-C, respectively, of detector array 72. The signals provided by detectors 72-A and 72-C are normalized for power variation using the signal of detector 72-B. The normalized signal from detector 72-A is a measure of the difference between the center wavelength of AO tuning element 20 and the lasing wavelength. The normalized signal from detector 72-C is a measure of the difference between the lasing wavelength and the wavelength of the nearest transmission peak of the grid fixing etalon.

Figure 12:
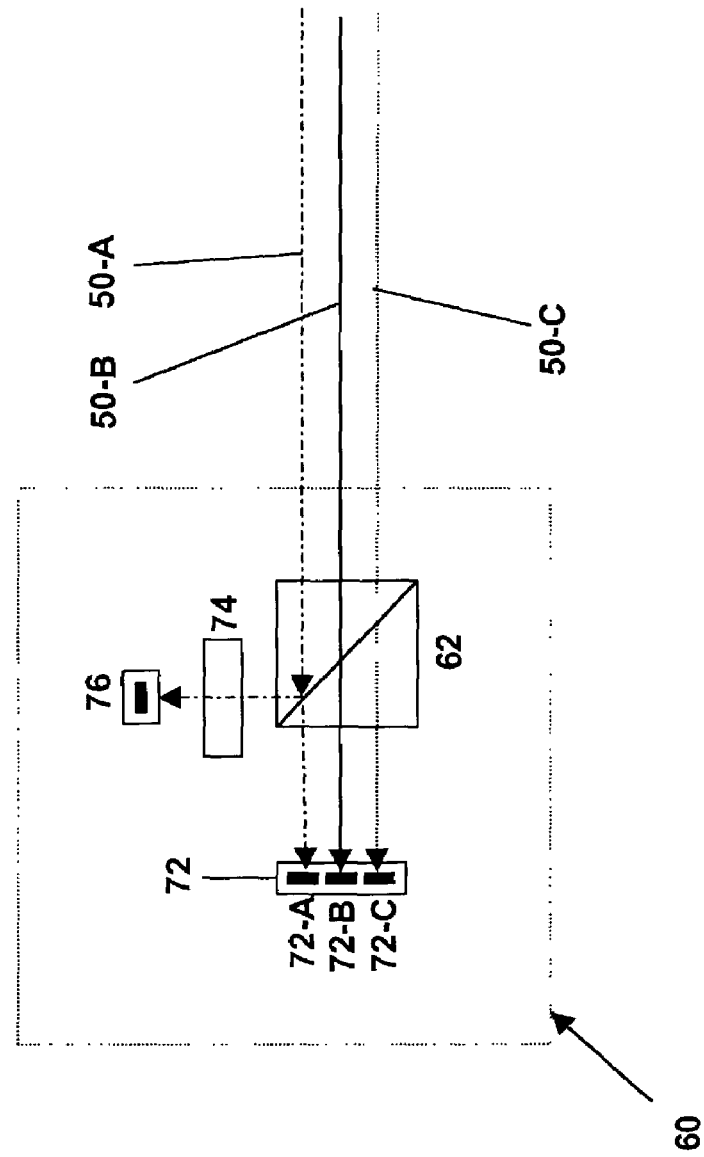
FIG. 12 shows an alternative embodiment of a monitor subassembly.

FIG. 12 shows a schematic diagram of an alternative embodiment of monitor subassembly 60, which provides an alternative means for monitoring. The embodiment of FIG. 12 differs from the embodiment of FIG. 11 in the method for monitoring wavelength. On FIG. 12, beam 50-A impinges on polarizing beam splitter 62, as on FIG. 11, and the reflected portion of beam 50-A is received by detector 76 after passage through linear transmission filter 74. Linear transmission filter 74 has a transmissivity which is very nearly a linear function of wavelength. The signal from detector 72-A is used to normalize the signal from detector 76, and the normalized signal from detector 76 suffices to measure the absolute wavelength with sufficient accuracy to determine the channel of laser operation.

Various methods of using the signals provided by the embodiments of FIGS. 11 and 12 to provide laser control will be apparent to the skilled art worker. A preferred approach is to utilize standard control methods to hold the temperature of grid fixing etalon 38 to a fixed value T0. The nominal etalon temperature T0 is determined during initial fabrication and test of laser assembly 30 so that the etalon transmission peaks are appropriately aligned to the desired discrete tuning grid. With this arrangement, the grid fixing etalon provides a fixed frequency reference for every laser channel.

To maintain proper alignment of the lasing mode with a transmission peak of grid fixing etalon 38, the electrical current provided to gain element 34 is controlled so that the normalized signal from detector 72-C is held constant at a predetermined value that provides proper alignment. During initial assembly and test of laser assembly 30, measurements are performed which determine the desired normalized signal from detector 72-C for each channel, and these values are stored in a first lookup table for use in the control system.

To maintain proper alignment of the lasing mode with the AO tuning element, the RF frequency provided to AO tuning element 20 is controlled so that the normalized signal from detector 72-A is held constant at a predetermined value that ensures proper alignment. During initial assembly and test of laser assembly 30, measurements are performed which determine the desired normalized signal from detector 72-A for each channel, and these values are stored in a second lookup table for use in the control system. It is possible to use the temperature of the AO tuning element as a control variable in addition to, or instead of, the RF frequency.

The wavelength measurement provided by the embodiments of FIGS. 11 and 12 is used to verify that the laser is lasing on the desired channel. If there is a discrepancy between the channel selected by the user and the channel measured by monitor subassembly 60, then a fault condition is transmitted to the laser control processor and/or to the user.

In the discussion of FIGS. 11 and 12, we have referred to normalizing a first detector signal relative to a second detector signal in order to obtain suitable control signals. In many cases, this normalization simply involves forming the ratio of the two signals, so that optical power fluctuations do not affect the control signals. In other cases, normalization may require more than just forming a ratio. If a background signal is present on one or both detectors (e.g. due to stray light), then it may be preferred to subtract out the background signal before forming the ratio to be used as a control signal. More generally, each normalized signal is a function of some or all of the detector signals. In addition, the detectors may be located other than as indicated in FIGS. 4, 11 and 12, and provide the same or equivalent functionality.

Several control mechanisms discussed in connection with FIGS. 11 and 12 are based on varying the optical length (i.e. physical length times index of refraction) of the laser resonator and/or elements within the resonator. For example, altering either the current applied to an electrically pumped semiconductor gain element, or the temperature of such a gain element, changes the optical length of the gain element and the round trip optical length of the resonator.

Figure 13:
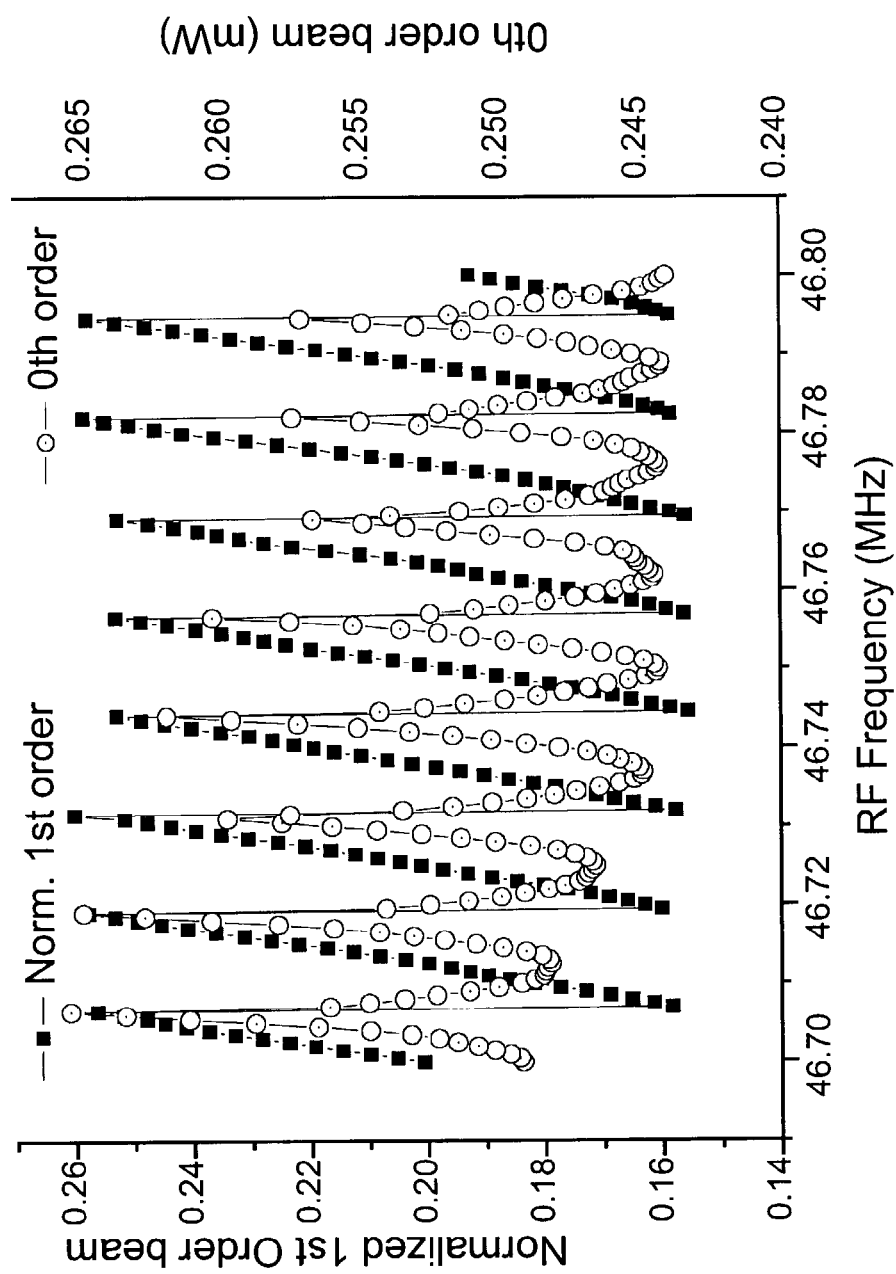
FIG. 13 shows measured monitor signals for zeroth and first order beams for an embodiment of the invention.

An example of the signals provided by backside monitor 60 on FIG. 4 is given in FIG. 13, which shows measured monitor signals from an embodiment of the invention as shown in FIG. 4 that includes grid fixing etalon 38. The open circles on FIG. 13 show the measured zeroth order monitor beam power (i.e. from beam 50-B on FIG. 4) vs. RF frequency applied to AO tuning element 20. The solid squares show the normalized first order monitor beam signal (i.e. from beam 50-A on FIG. 4) vs. RF frequency applied to AO tuning element 20. For this example, the normalized first order signal is the ratio of first order power to zeroth order power. As the RF frequency applied to AO tuning element 20 varies, the laser tunes discretely from channel to channel, and transitions from one channel to an adjacent channel appear as discontinuities and/or slope discontinuities in the signals shown on FIG. 13.

The zeroth and first order monitor signals shown on FIG. 13 vary smoothly between the discontinuities caused by channel transitions, which enables the use of these signals in various control schemes to ensure proper alignment of the tuning element and lasing mode whereby drift within AO tuning element 20 does not lead to an undesired channel transition. For example, one approach is to control the RF frequency applied to AO tuning element 20 to ensure the zeroth order signal is held at a local minimum. An alternative approach is to control the RF frequency applied to AO tuning element 20 to ensure the normalized first order signal is held constant at a suitably chosen fixed value (e.g. 0.21 would be one suitable choice based on the results of FIG. 13). Alternatively, an initial calibration procedure may be employed to record the zeroth and/or first order monitor signals obtained when the laser is tuned to the center of each channel in a lookup table. Subsequently, when the laser is tuned to a particular channel, the tuning element is controlled (e.g. by altering the RF frequency applied to AO tuning element 20 and/or the temperature of AO tuning element 20) to ensure the monitor signals do not drift from the values stored in the lookup table for that channel.

A preferred embodiment of the SDSF tuning mechanism makes use of an AO device in zeroth order transmission as the SDSF tuning element. Since the AO interaction is a typical example of a three wave parametric interaction, other three wave parametric interaction devices, such as electro-optic devices or nonlinear optical devices, are also suitable SDSF tuning elements. Alternatively, the AO interaction can be regarded as the diffraction of light by an optically thick grating, so thick grating devices (i.e. volume holograms) with controllable grating properties are also suitable SDSF tuning elements.

SDSF tuning elements may operate either in transmission or in reflection. Since three wave mixing and diffraction from a volume hologram are both narrowband processes which necessarily provide a notch filter in transmission, SDSF tuning elements operate most simply in transmission. Reflective mode SDSF tuning elements may be constructed in various ways. One approach is to bond a mirror to a transmissive mode SDSF tuning element. An alternative approach is to combine several volume holograms which provide narrowband reflection in different wavelength bands into an assembly with a notch filter in its reflectivity spectrum.

An SDSF tuning element must impose a spectrally dependent distortion on an optical beam. For this reason, suitable SDSF tuning elements are either bulk optical devices where the beam amplitude and phase profiles are two-dimensional, or planar waveguide devices where the beam amplitude and phase profiles are one-dimensional.

Therefore, an "SDSF tuning element" comprises either a bulk or a planar waveguide device which operates in transmission or in reflection to provide a tunable spectral notch filter wherein the physical mechanism is either diffraction from at least one thick grating, or parametric interaction. Suitable control inputs for SDSF tuning elements include electrical signals with prescribed frequency and/or amplitude.

A preferred embodiment of the SDSF tuning mechanism makes use of a single mode waveguide gain medium, which provides an intracavity spatial filter. There are other suitable methods of providing an intracavity spatial filter, such as the insertion of a pinhole into the laser cavity. The purpose of the spatial filter is to make the round trip loss a more sensitive function of cavity alignment and beam distortion, which will tend to increase the single mode tuning range. However, it is possible to obtain an adequate single mode tuning range for certain applications via the SDSF tuning mechanism without a spatial filter.

As is evident from the preceding discussion, the present invention provides a laser and laser tuning mechanism, of which a preferred embodiment is a zeroth order acousto-optically tuned laser. As such, it will be apparent to one skilled in the art that various modifications to the details of construction and method shown here may be made without departing from the scope of the invention, e.g. folding the optical path within the laser cavity and/or tuning element in order to make the laser more compact. The application of well known laser engineering principles to lasers which tune via the disclosed mechanism falls within the scope of the present invention.

What is claimed is:

1. A laser comprising an optical resonator, said optical resonator comprising:

a) a pumped gain medium;

b) a tuning element comprising a tunable spectral notch filter;
c) a grid fixing etalon;
wherein said optical resonator is aligned such that radiation is emitted from said optical resonator at substantially a single emission wavelength which is selected by said tuning element;
wherein the laser further comprises means for monitoring a wavelength difference between said single emission wavelength and a wavelength of maximum transmission of said grid fixing etalon.

2. The laser of claim 1 wherein the length of said gain medium is selected so that said gain medium has a free spectral range (FSR) which is substantially equal to the FSR of said grid fixing etalon divided by an integer.

3. The laser of claim 1 wherein the round trip path length of said optical resonator is selected so that said optical resonator has an FSR which is substantially equal to the FSR of said grid etalon divided by an integer.

4. A laser comprising a optical resonator, said optical resonator comprising:
a) a pumped gain medium, wherein the gain medium is an electrically pumped semiconductor single mode waveguide;
b) an acousto-optic tuning element wherein an optical beam circulating within said optical resonator passes through said tuning element as a zeroth order beam; and
c) a grid fixing etalon;
wherein said optical resonator is aligned such that radiation is emitted from said optical resonator at substantially a single emission wavelength which is selected by said tuning element;
wherein said optical resonator is configured as a standing wave resonator;
wherein the length of said gain medium is selected such that said gain medium has a free spectral range (FSR) which is substantially equal to the FSR of said grid fixing etalon divided by an integer.

5. The laser of claim 4 wherein the round trip path length of said optical resonator is selected so that said optical resonator has an FSR which is substantially equal to the FSR of said grid fixing etalon divided by an integer.

6. The laser of claim 5 further comprising means for monitoring a wavelength difference between said single emission wavelength and a center wavelength of said tuning element.

7. The laser of claim 6 further comprising means for monitoring a wavelength difference between said single emission wavelength and a wavelength of maximum transmission of said grid fixing etalon.

8. The laser of claim 7 further comprising means for monitoring said single emission wavelength.

9. A method for generating a laser beam comprising:
a) pumping a gain medium positioned within an optical resonator, said optical resonator defining an intracavity beam path;
b) passing light traveling on said beam path through a tunable spectral notch filter provided by a tuning element; and
c) passing light traveling on said beam oath through a grid fixing etalon;
d) emitting a portion of a beam reflected from said grid fixing etalon to provide an etalon signal;
e) emitting a portion of a beam circulating on said beam path to provide a reference signal;
f) deriving a normalized etalon signal from said etalon signal and said reference signal; and
g) controlling the optical length of said beam path to hold said normalized etalon signal fixed to a predetermined value;
wherein said optical resonator is aligned such that radiation is emitted from said optical resonator at substantially a single emission wavelength which is selected by said tuning element.

10. The method of claim 9 wherein said gain medium is an electrically pumped semiconductor single mode waveguide and wherein said optical length is varied by altering the current supplied to said gain medium.

11. The method of claim 9 wherein the length of said gain medium is selected such that said gain medium has a free spectral range (FSR) which is substantially equal to the FSR of said grid fixing etalon divided by an integer.

12. The method of claim 9 wherein the optical length of said beam path is selected such that said optical resonator has an FSR which is substantially equal to the FSR of said grid fixing etalon divided by an integer.

13. A method for generating a laser beam comprising:
a) pumping a gain medium positioned within an optical resonator, said optical resonator defining an intracavity beam path; and
b) passing light traveling on said beam path through a tunable spectral notch filter provided by a tuning element;
c) emitting a monitor beam from said optical resonator;
d) splitting said monitor beam into a first beam and a second beam;
e) filtering said second beam with an optical filter having a linear dependence on wavelength;
f) detecting said first beam at a first detector to provide a first signal;
g) detecting said filtered second beam at a second detector to provide a second signal; and
h) deriving a wavelength measurement from said first signal and said second signal;
wherein said optical resonator is aligned such that radiation is emitted from said optical resonator at substantially a single emission wavelength which is selected by said tuning element.

14. A method for generating a laser beam comprising:
a) pumping a gain medium positioned within an optical resonator, said optical resonator defining an intracavity beam path, wherein said gain medium comprises an electrically pumped semiconductor single mode waveguide, wherein said optical resonator is configured as a standing wave resonator;
b) passing light traveling on said beam path through an acousto-optic tuning element in zeroth order so that said light is not frequency shifted;
c) passing light traveling on said beam path through a grid fixing etalon
wherein said optical resonator is aligned such that radiation is emitted from said optical resonator at substantially a single emission wavelength which is selected by said tuning element;
wherein the length of said gain medium is selected such that said gain medium has a free spectral range (FSR) which is substantially equal to the FSR of said grid fixing etalon divided by an integer.

15. The method of claim 14 wherein the optical length of said beam path is selected such that said optical resonator has an FSR which is substantially equal to the FSR of said grid fixing etalon divided by an integer.

16. The method of claim 15 further comprising:
   d) emitting a portion of a zeroth order beam within said optical resonator to provide a zeroth order monitor beam;
   e) emitting a portion of a first order beam within said optical resonator to provide a first order monitor beam; and
   f) emitting a portion of a beam reflected from a surface of said grid fixing etalon to provide an etalon monitor beam.

* * * * *